US007923628B2

(12) United States Patent
Deligianni et al.

(10) Patent No.: US 7,923,628 B2
(45) Date of Patent: Apr. 12, 2011

(54) METHOD OF CONTROLLING THE COMPOSITION OF A PHOTOVOLTAIC THIN FILM

(75) Inventors: Hariklia Deligianni, Yorktown Heights, NY (US); Harold J. Hovel, Yorktown Heights, NY (US); Raman Vaidyanathan, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/556,335

(22) Filed: Sep. 9, 2009

(65) Prior Publication Data

US 2010/0218814 A1  Sep. 2, 2010

(51) Int. Cl.
*H01L 31/0216* (2006.01)
*H01L 31/18* (2006.01)
*H01L 21/3205* (2006.01)
*H01L 21/31* (2006.01)

(52) U.S. Cl. ........ 136/256; 136/262; 136/264; 136/265; 438/72; 438/584; 438/758; 257/E21.294; 257/E21.24; 257/E21.158; 257/E31.119

(58) Field of Classification Search .................. None
See application file for complete search history.

(56) References Cited

U.S. PATENT DOCUMENTS

| | | | | |
|---|---|---|---|---|
| 3,869,322 A | * | 3/1975 | Cuomo et al. ............... | 438/509 |
| 4,640,001 A | | 2/1987 | Koiwai et al. | |
| 5,399,504 A | * | 3/1995 | Ohsawa ........................ | 438/16 |
| 5,436,204 A | | 7/1995 | Albin et al. | |
| 5,441,577 A | * | 8/1995 | Sasaki et al. .................. | 136/244 |
| 5,739,886 A | * | 4/1998 | Shibahara .................... | 349/139 |
| 6,368,475 B1 | * | 4/2002 | Hanson et al. ............. | 204/275.1 |
| 6,963,024 B2 | | 11/2005 | Ojima et al. | |
| 7,026,258 B2 | | 4/2006 | Taunier et al. | |
| 2007/0215195 A1 | * | 9/2007 | Buller et al. .................. | 136/243 |
| 2007/0295390 A1 | | 12/2007 | Sheats et al. | |
| 2008/0072953 A1 | | 3/2008 | Stephens et al. | |
| 2008/0135090 A1 | | 6/2008 | Corrales | |
| 2008/0202584 A1 | * | 8/2008 | Basol ............................ | 136/262 |
| 2008/0271781 A1 | * | 11/2008 | Kushiya et al. ............... | 136/256 |

OTHER PUBLICATIONS

Keyes et al. "Influence of Na on the Electro-Optical Properties of Cu(In,Ga)Se2." Presented at the 26th IEEE Photovoltaic Specialists Conference, Sep. 29-Oct. 3, 1997, Anaheim, California.*
Hollingsworth, et al. "Annealing Temperature Effects on CuInSe2/CdS Solar Cells." Solar Cells, 16 (1986) 457-477.*
Hu et al. Solar Cells: from Basics to Advanced Systems. McGraw Hill Book Company, 1983, pp. 83-84.*
Buschow et al. (2001) Encyclopedia of Materials-Science and Technology, vols. 1-11. Elsevier. pp. 1131-1132.*

* cited by examiner

*Primary Examiner* — Jennifer K Michener
*Assistant Examiner* — Magali P Slawski

(57) ABSTRACT

A method of reducing the loss of elements of a photovoltaic thin film structure during an annealing process, includes depositing a thin film on a substrate, wherein the thin film includes a single chemical element or a chemical compound, coating the thin film with a protective layer to form a coated thin film structure, wherein the protective layer prevents part of the single chemical element or part of the chemical compound from escaping during an annealing process, and annealing the coated thin film structure to form a coated photovoltaic thin film structure, wherein the coated photovoltaic thin film retains the part of the single chemical element or the part of the chemical compound that is prevented from escaping during the annealing by the protective layer.

7 Claims, 2 Drawing Sheets

METHOD OF CONTROLLING THE COMPOSITION OF A PHOTOVOLTAIC THIN FILM

BACKGROUND OF THE INVENTION

1. Technical Field

The present invention relates to methods for controlling the composition of a photovoltaic thin film.

2. Discussion of the Related Art

Existing methods for producing a photovoltaic thin film cell utilize annealing in air or in selenium, tellurium or sulfur containing atmospheres.

FIG. 1 illustrates part of an existing method for producing tellurium, selenium or sulfur containing compound semiconductor thin films such as cadmium telluride (CdTe), cadmium selenide (CdSe), cadmium sulfide (CdS), zinc sulfide (ZnS), tin tetrasulfide ($SnS_4$), copper indium diselenide ($CuInSe_2$), copper indium disulfide ($CuInS_2$), copper gallium diselenide ($CuGaSe_2$), copper gallium disulfide ($CuGaS_2$), copper bismuth sulfide ($Cu_3BiS_3$), copper sulfide zinc tin tetrasulfide ($Cu_2ZnSnS_4$), copper indium gallium diselenide ($CuInGaSe_2$), or copper indium gallium disulfide ($CuInGaS_2$) photovoltaic thin film cells. As shown in FIG. 1, the method includes an anneal step in a sulfur or selenium atmosphere. A copper indium diselenide ($CuInSe_2$) or copper indium gallium diselenide ($CuInGaSe_2$) photovoltaic thin film may lose a light element such as selenium or sulfur during annealing. Although the lost selenium can be replaced after annealing by performing an additional process step, this increases the time, cost and complexity of forming a photovoltaic thin film cell.

SUMMARY OF THE INVENTION

In accordance with an exemplary embodiment of the present invention, there is provided a method of reducing the loss of elements of a photovoltaic thin film during an annealing process. The reduction in element loss is accomplished by coating a thin film with a protective layer that is capable of preventing elements of the thin film from escaping during an annealing process in which a photovoltaic thin film is produced. This method can be used in the production of a photovoltaic thin film cell. Therefore, this method can decrease the time, cost and complexity of producing a photovoltaic thin film cell.

In accordance with an exemplary embodiment of the present invention, a method of reducing the loss of elements of a photovoltaic thin film structure during an annealing process, comprises: depositing a thin film on a substrate, wherein the thin film includes a single chemical element or a chemical compound; coating the thin film with a protective layer to form a coated thin film structure, wherein the protective layer prevents part of the single chemical element or part of the chemical compound from escaping during an annealing process; and annealing the coated thin film structure to form a coated photovoltaic thin film structure, wherein the coated photovoltaic thin film retains the part of the single chemical element or the part of the chemical compound that is prevented from escaping during the annealing by the protective layer.

In accordance with an exemplary embodiment of the present invention, a photovoltaic thin film cell, comprises: a substrate; a photovoltaic thin film disposed on the substrate; a protective layer coating the photovoltaic thin film, wherein the protective layer comprises a chemical compound selected from the group consisting of silicon nitride (SiN), silicon dioxide ($SiO_2$), titanium dioxide ($TiO_2$), tantalum pentoxide ($Ta_2O_5$), aluminum oxide ($Al_2O_3$), zinc oxide (ZnO), tin dioxide ($SnO_2$), indium tin oxide (ITO), titanium nitride (TiN), silicide (Si), tin oxide (SnO), indium oxide ($In_2O_3$), cadmium oxide (CdO), tantalum nitride (TaN), zinc sulfide (ZnS) and cadmium sulfide (CdS); a contact grid disposed on the protective layer; an anti-reflective coating disposed on the contact grid; and a cover glass disposed on the anti-reflective coating.

In accordance with an exemplary embodiment of the present invention, a photovoltaic thin film cell, comprises: a substrate; a photovoltaic thin film disposed on the substrate; a protective layer coating the photovoltaic thin film, wherein the protective layer is selected from the group consisting of a metal and a non-metal; a contact grid disposed on the protective layer; an anti-reflective coating disposed on the contact grid; and a cover glass disposed on the anti-reflective coating.

In accordance with an exemplary embodiment of the present invention, a method of forming a photovoltaic thin film cell, comprises: disposing a thin film on a substrate, wherein the thin film includes a single chemical element or a chemical compound; coating the thin film with a protective layer to form a first coated thin film structure, wherein the protective layer prevents part of the single chemical element or part of the chemical compound from escaping during an annealing process; annealing the coated thin film structure to form a coated photovoltaic thin film structure, wherein the coated photovoltaic thin film retains the part of the single chemical element or the part of the chemical compound that is prevented from escaping during the annealing by the protective layer; removing the protective layer from the coated photovoltaic thin film structure to form an uncoated photovoltaic thin film structure; disposing a contact grid on the uncoated photovoltaic thin film structure; disposing an anti-reflective coating on the contact grid; and disposing a cover glass on the anti-reflective coating to form a photovoltaic thin film cell.

The foregoing features are of representative embodiments and are presented to assist in understanding the invention. It should be understood that they are not intended to be considered limitations on the invention as defined by the claims, or limitations on equivalents to the claims. Therefore, this summary of features should not be considered dispositive in determining equivalents. Additional features of the invention will become apparent in the following description, from the drawings and from the claims.

DETAILED DESCRIPTION OF EXEMPLARY EMBODIMENTS

In accordance with an exemplary embodiment of the present invention, disclosed herein is a novel method of producing a photovoltaic thin film cell. This method incorporates another novel method of reducing the loss of elements of a photovoltaic thin film during an annealing process. Both methods will be described in detail hereinafter with reference to FIG. 2.

Figure 1:
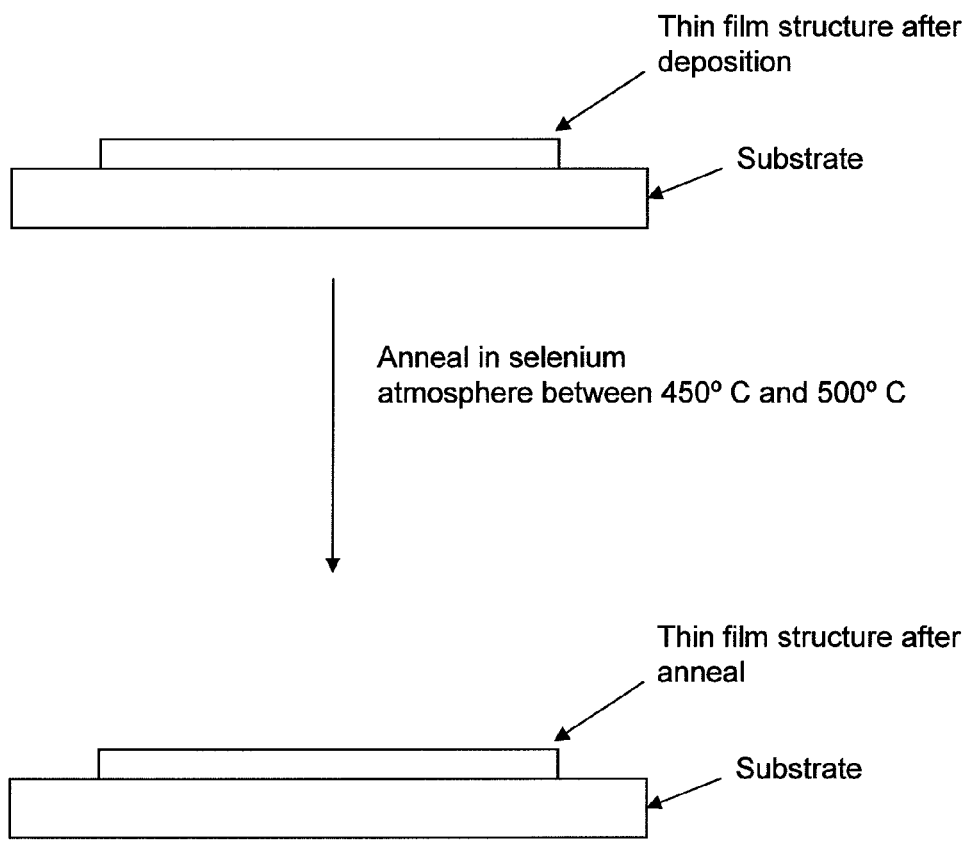
FIG. 1 illustrates part of an existing method for producing a photovoltaic thin film cell.
Figure 2:
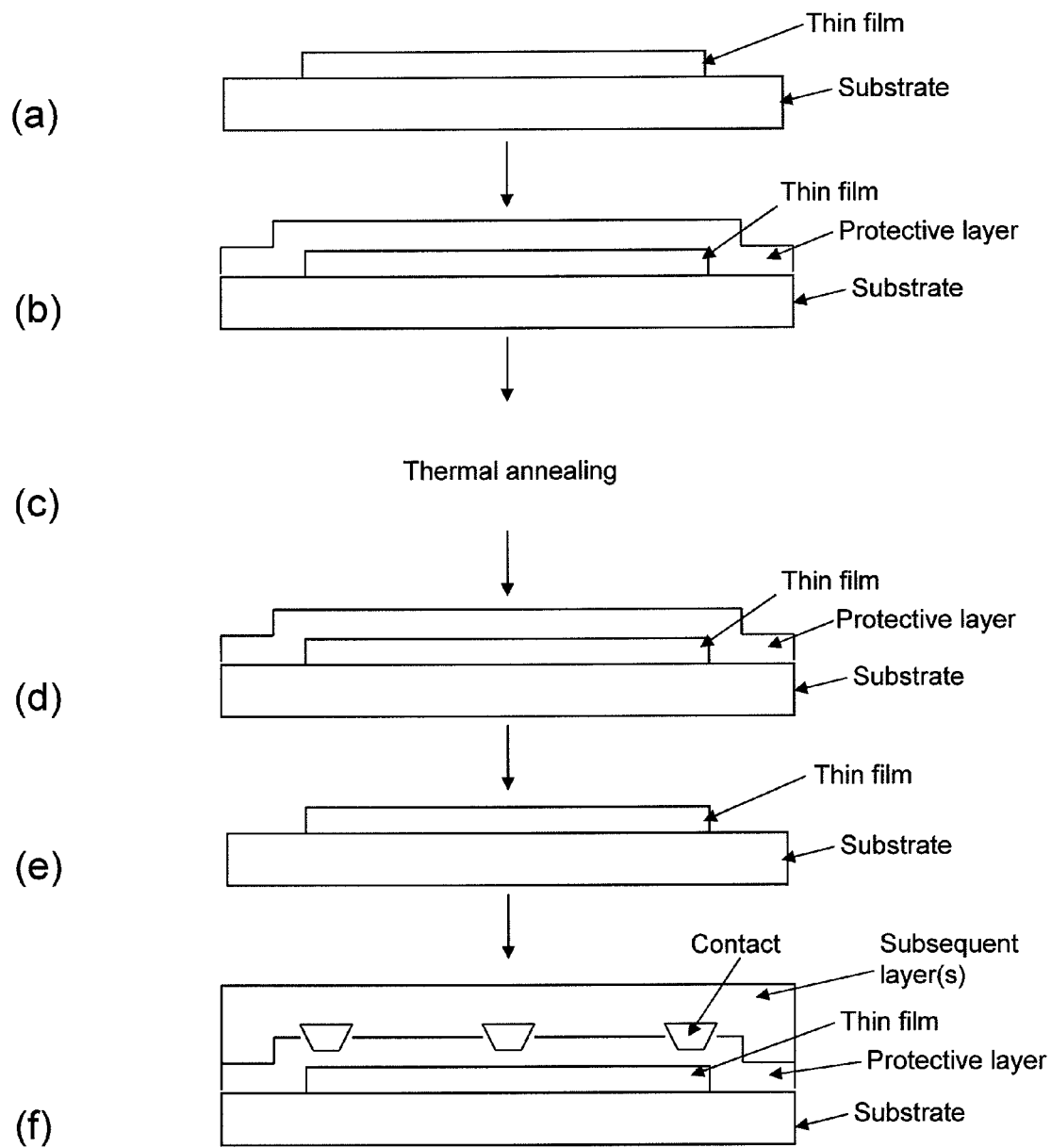
FIG. 2 illustrates a method for producing a photovoltaic thin film cell according to an exemplary embodiment of the present invention.

FIG. 2 illustrates a method for producing a photovoltaic thin film cell according to an exemplary embodiment of the present invention.

In (a) of FIG. 2, a substrate is provided with a thin film deposited thereon. At this stage, the thin film may be photovoltaic or not. It is to be understood that the substrate may be made of amorphous (a-Si or a-Si:H), protocrystalline, nanocrystalline (nc-Si or nc-Si:H) or black silicon. The thin film may be made of copper indium gallium diselenide (CuInGaSe$_2$), copper indium gallium disulfide (CuInGaS$_2$), copper gallium diselenide (CuGaSe$_2$), copper gallium disulfide (CuGaS$_2$), copper indium diselenide (CuInSe2), copper indium disulfide (CuInS2), or any copper, indium, selenium, sulfur, gallium, tellurium, cadmium, zinc, tin or bismuth containing materials, for example.

In (b) of FIG. 2, the thin film is coated with a protective layer to form a coated thin film structure. The protective layer can be made of any material that prevents the elements of the thin film from escaping during an annealing process such as a thermal annealing. The materials making up the protective layer may include silicon nitride (SiN), silicon dioxide (SiO$_2$), titanium dioxide (TiO$_2$), tantalum pentoxide (Ta$_2$O$_5$), aluminum oxide (Al$_2$O$_3$), zinc oxide (ZnO), tin dioxide (SnO$_2$), indium tin oxide (ITO), a polymer solution, carbon nanotubes, a metal or a non-metal, such as sulfur or selenium, for example. The protective layer may be coated by a spinning, spraying, anodization, electrodeposition or vapor deposition technique, for example.

It is to be understood that other protective layers can be used that include impurities that will diffuse into the thin film. In this manner, the protective layer can act as an intentional dopant carrier that will allow doping of the photovoltaic thin film with specific elements or create certain interfaces. Examples given here are protective layers doped with excess sodium, sulfur, phosphorus, or boron or protective layers having an n+−p+−i interface. For example, a protective layer including sulfur can have part of the sulfur diffuse into the thin film during annealing while another part of the sulfur remains in the protective layer.

Other dielectrics deposited or formed by spin-on, plasma enhanced chemical vapor deposition (PECVD), chemical vapor deposition (CVD), atomic layer deposition (ALD) or anodization can be used as the protective layer. Some examples are titanium dioxide (TiO$_2$), titanium nitride (TiN), silicide (Si), indium tin oxide (ITO), tin oxide (SnO), indium oxide (In$_2$O$_3$), cadmium oxide (CdO), tantalum nitride (TaN), tantalum pentoxide (Ta$_2$O$_5$), aluminum oxide (Al$_2$O$_3$), zinc oxide (ZnO), zinc sulfide (ZnS) and cadmium sulfide (CdS).

In (c) of FIG. 2, the coated thin film structure is annealed to form a coated photovoltaic thin film structure. In other words, the annealing of the thin film converts it into the photovoltaic thin film. For example, if the thin film is comprised of metals such as Cu/In/Ga and sulfur, after annealing the resulting photovoltaic thin film is a chalchopyrite material such as CuInGaS$_2$. Further, if the thin film is comprised of binary alloys such as CuIn$_2$ and CuGa$_2$ and is coated with selenium, after annealing the resulting photovoltaic thin film can be CuInGaSe$_2$. The temperature range of the annealing can be from about 100° C. to about 900° C. In general, the coated thin film structure is annealed to a temperature from about 300° C. to about 600° C. depending on the thin film and coating.

Since the thin film in (b) of FIG. 2 is coated with the protective layer, there is a minimal loss of the photovoltaic thin film's elements (e.g., selenium) during annealing. This is so, because the protective layer acts as a barrier to outward diffusion of the light element during annealing. Therefore, the photovoltaic thin film in (d) of FIG. 2 has a similar constitution as the thin film in (b) of FIG. 2. In other words, the photovoltaic thin film in (d) of FIG. 2 retains part of a single chemical element or part of a chemical compound of the thin film in (b) of FIG. 2 that is prevented from escaping during the annealing by the protective layer. Therefore, there is no need for a subsequent process step to replace the photovoltaic thin film in (d) of FIG. 2 with the lost elements.

Since the protective layer is used as discussed above, there may be some impurities that accumulate at the interface between the coated photovoltaic thin film and the protective layer in (d) of FIG. 2. Such impurities may include sodium, potassium, chlorine, excess selenium, and sulfur. These impurities may be removed by removing the protective layer to clean the top surface of the photovoltaic thin film as shown in (e) of FIG. 2. How this is done depends on the material used as the protective layer. For example, if silicon nitride (SiN) is used as the protective layer it can be removed by an etching technique such as reactive ion etching or dry etching. If spin-on oxide or silicon dioxide (SiO$_2$) is used as the protective layer it can be removed by an acid such as dilute hydrofluoric (HF) acid. At this time, films can be patterned over the cleaned surface of the photovoltaic thin film shown in (e) of FIG. 2 to create intermediate contacts for structures with the photovoltaic thin film. For example, subsequent layers such as a contact grid can be deposited on the photovoltaic thin film, an anti-reflective coating can be deposited on the contact grid and a cover glass can be deposited on the anti-reflective coating, thereby producing a photovoltaic thin film cell.

On the other hand, if a light transparent layer made of silicon dioxide (SiO$_2$) or silicon nitride (SiN) is used as the protective layer, the protective layer may remain on the photovoltaic thin film and a subsequent layer can be patterned directly thereon as shown in (f) of FIG. 2. In this case, the protective layer is used as a mask. For example, as shown in (f) of FIG. 2, subsequent layers such as a contact grid can be deposited on the protective layer, an anti-reflective coating can be deposited on the contact grid and a cover glass can be deposited on the anti-reflective coating, thereby producing a photovoltaic thin film cell.

As can be seen from the above description of the present invention, by including the protective layer, a photovoltaic thin film can be annealed without loss of light elements and without additional processing. Further, by using the protective layer, which can be easily cleaned or kept on as a doping deficient layer, thin film cells comprising composition-sustaining photovoltaic thin films can be manufactured in a cost-effective manner. Furthermore, the protective layer allows the formation of large grains in a single step.

It is to be understood that the sequence between the process steps shown in the accompanying figures and described herein may differ depending on the manner in which the present invention is used to create a final product such as a photovoltaic thin film structure. Given the teachings of the present invention, one of ordinary skill in the art will be able to contemplate these and similar implementations or configurations of the present invention.

It should also be understood that the above description is only representative of illustrative embodiments. For the convenience of the reader, the above description has focused on a representative sample of possible embodiments, a sample that is illustrative of the principles of the invention. The description has not attempted to exhaustively enumerate all possible variations. That alternative embodiments may not have been presented for a specific portion of the invention, or that further undescribed alternatives may be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

What is claimed is:

1. A method of forming a photovoltaic thin film cell, comprising:
    disposing a thin film on a substrate, wherein the thin film includes a chemical compound;
    coating the thin film with a protective layer to form a first coated thin film structure, wherein the protective layer prevents part of the chemical compound from escaping during an annealing process;
    annealing the coated thin film structure to form a coated photovoltaic thin film structure, wherein the coated photovoltaic thin film retains the part of the chemical compound that is prevented from escaping during the annealing by the protective layer;
    removing the protective layer from the coated photovoltaic thin film structure to form an uncoated photovoltaic thin film structure;
    disposing a contact grid on the uncoated photovoltaic thin film structure;
    disposing an anti-reflective coating on the contact grid; and
    disposing a cover glass on the anti-reflective coating to form a photovoltaic thin film cell,
    wherein the chemical compound of the thin film is selected from the group consisting of copper indium gallium diselenide ($CuInGaSe_2$), copper indium gallium disulfide ($CuInGaS_2$), copper gallium diselinide ($CuGaSe_2$), copper gallium disulfide ($CuGaS_2$) and copper indium disulfide ($CuInS_2$).

2. The method of claim 1, wherein the protective layer comprises a chemical compound selected from the group consisting of silicon nitride (SiN), silicon dioxide ($SiO_2$), titanium dioxide ($TiO_2$), tantalum pentoxide ($Ta_2O_5$), aluminum oxide ($Al_2O_3$), zinc oxide (ZnO), tin dioxide ($SnO_2$), indium tin oxide (ITO), titanium nitride (TiN), silicide (Si), tin oxide (SnO), indium oxide ($In_2O_3$), cadmium oxide (CdO), tantalum nitride (TaN), zinc sulfide (ZnS) and cadmium sulfide (CdS).

3. The method of claim 1, wherein the protective layer is coated by a technique selected from the group consisting of spinning, spraying, anodization, electrodeposition and vapor deposition.

4. The method of claim 1, wherein the protective layer is doped with a chemical element selected from the group consisting of sodium, sulfur, phosphorous, boron and selenium.

5. The method of claim 1, wherein a temperature range of the annealing is from about 100° C. to about 900° C.

6. The method of claim 1, wherein the protective layer comprises a chemical compound selected from the group consisting of titanium dioxide ($TiO_2$), tantalum pentoxide ($Ta_2O_5$), zinc oxide (ZnO), tin dioxide ($SnO_2$), indium tin oxide (ITO), titanium nitride (TiN), silicide (Si), tin oxide (SnO), indium oxide ($In_2O_3$), cadmium oxide (CdO), tantalum nitride (TaN), zinc sulfide (ZnS) and cadmium sulfide (CdS).

7. The method of claim 1, wherein the coated thin film structure is annealed to a temperature between 300° C. to 600° C.

* * * * *